United States Patent
Childress et al.

(10) Patent No.: US 8,045,298 B2
(45) Date of Patent: Oct. 25, 2011

(54) THREE TERMINAL MAGNETIC SENSING DEVICE HAVING A TRACK WIDTH DEFINED IN A LOCALIZED REGION BY A PATTERNED INSULATOR AND METHODS OF MAKING THE SAME

(75) Inventors: Jeffrey R. Childress, San Jose, CA (US); Robert E. Fontana, Jr., San Jose, CA (US); Jui-Lung Li, San Jose, CA (US); Sergio Nicoletti, Sinard (FR)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 977 days.

(21) Appl. No.: 12/004,235

(22) Filed: Dec. 20, 2007

(65) Prior Publication Data

US 2009/0161262 A1    Jun. 25, 2009

(51) Int. Cl.
G11B 5/33 (2006.01)
(52) U.S. Cl. ...................................... 360/314
(58) Field of Classification Search .................. 360/314, 360/245.3, 234.3, 245, 324.1, 324.2, 324.12
See application file for complete search history.

(56) References Cited

U.S. PATENT DOCUMENTS

| | | | | |
|---|---|---|---|---|
| 4,831,429 | A * | 5/1989 | Nakashima et al. | 257/55 |
| 7,061,727 | B2 * | 6/2006 | Hoshino et al. | 360/320 |
| 7,336,449 | B2 * | 2/2008 | Lille | 360/313 |
| 7,635,599 | B2 * | 12/2009 | Fontana et al. | 438/3 |
| 7,639,459 | B2 * | 12/2009 | Childress et al. | 360/324.2 |
| 7,710,691 | B2 * | 5/2010 | Childress et al. | 360/324.2 |
| 2003/0080754 | A1 * | 5/2003 | Harris et al. | 324/649 |
| 2005/0285526 | A1 * | 12/2005 | Moon et al. | 313/582 |
| 2006/0152858 | A1 * | 7/2006 | Lille | 360/324.2 |
| 2006/0152860 | A1 * | 7/2006 | Childress et al. | 360/324.2 |
| 2007/0238198 | A1 * | 10/2007 | Fontana et al. | 438/3 |

* cited by examiner

*Primary Examiner* — Allen Cao
(74) *Attorney, Agent, or Firm* — John J. Oskorep; Rambod Nader

(57) ABSTRACT

A three terminal magnetic sensing device (TTM) having a trackwidth defined in a localized region by a patterned insulator, and methods of making the same, are disclosed. In one illustrative example, one or more first sensor layers (e.g. which includes a "base" layer) are formed over a collector substrate. A patterned insulator which defines a central opening exposing a top layer of the one or more first sensor layers is then formed. The central opening has a width for defining a trackwidth (TW) of the TTM. Next, one or more second sensor layers are formed over the top layer of the one or more first sensor layers through the central opening of the patterned insulator. The one or more second sensor layers may include a tunnel barrier layer formed in contact with the top layer of the one or more first sensor layers, as well as an "emitter" layer. Various embodiments and techniques are provided.

25 Claims, 12 Drawing Sheets

THREE TERMINAL MAGNETIC SENSING DEVICE HAVING A TRACK WIDTH DEFINED IN A LOCALIZED REGION BY A PATTERNED INSULATOR AND METHODS OF MAKING THE SAME

BACKGROUND

1. Field of the Technology

The present disclosure relates generally to three terminal magnetic sensors (TTMs) suitable for use in magnetic heads, and more specifically to a TTM having a trackwidth defined in a localized region by a patterned insulator and methods of making the same.

2. Description of the Related Art

Typically, magnetoresistive (MR) sensors have been used as read sensors in hard disk drives. An MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the disk in a disk drive, because the external field from the recorded magnetic medium (the signal field) causes a change in the direction of magnetization in the read element, which causes a change in resistance of the read element and a resulting change in the sensed current or voltage.

A three terminal magnetic (TTM) sensing device of a magnetic head may comprise a spin valve transistor (SVT), for example, which is a vertical spin injection device having electrons injected over a barrier layer into a free layer. The electrons undergo spin-dependent scattering, and those that are only weakly scattered retain sufficient energy to traverse a second barrier. The current over the second barrier is referred to as the magneto-current. Conventional SVTs are constructed using a traditional three-terminal framework having an "emitter-base-collector" structure of a bipolar transistor. SVTs further include a spin valve (SV) on a metallic base region, whereby the collector current is controlled by the magnetic state of the base region using spin-dependent scattering. Although the TTM may involve an SVT where both barrier layers are Schottky barriers, the TTM may alternatively incorporate a magnetic tunnel transistor (MTT) where one of the barrier layers is a Schottky barrier and the other barrier layer is a tunnel barrier, or a double junction structure where both barrier layers are tunnel barriers.

FIG. 1 illustrates TTM operation associated with a conventional SVT 100 which has a semiconductor emitter region 102, a semiconductor collector region 104, and a base region 106 which contains a spin valve. The semiconductors and magnetic materials used in SVT 100 may include an n-type silicon (Si) material for emitter 102 and collector 104, and a $Ni_{80}Fe_{20}$/Cu/Co spin valve for the region 106. Energy barriers, also referred to as Schottky barriers, are formed at the junctions between the metal base 106 and the semiconductors. It is desirable to obtain a high quality energy barrier at these junctions with good rectifying behavior. Therefore, thin layers of materials (e.g. platinum and gold) are oftentimes used at the emitter 102 and collector 104, respectively. Moreover, these thin layers separate the magnetic layers from the semiconductor materials.

A TTM operates when current is introduced between emitter region 102 and base region 106, denoted as $I_E$ in FIG. 1. This occurs when electrons are injected over the energy barrier and into base region 106 by biasing the emitter such that the electrons are traveling perpendicular to the layers of the spin valve. Because the electrons are injected over the energy barrier, they enter base region 106 as non-equilibrium hot electrons, whereby the hot-electron energy is typically in the range of 0.5 and 1.0 eV depending upon the selection of the metal/semiconductor combination. The energy and momentum distribution of the hot electrons change as the electrons move through base region 106 and are subjected to inelastic and elastic scattering. As such, electrons are prevented from entering collector region 104 if their energy is insufficient to overcome the energy barrier at the collector side. Moreover, the hot-electron momentum must match with the available states in the collector semiconductor to allow for the electrons to enter collector region 104. The collector current $I_C$, which indicates the fraction of electrons collected in collector region 104, is dependent upon the scattering in base region 106 which is spin-dependent when base region 106 contains magnetic materials. Furthermore, an external applied magnetic field controls the total scattering rate which may, for example, change the relative magnetic alignment of the two ferromagnetic layers of the spin valve. The magnetocurrent (MC), which is the magnetic response of the TTM, can be represented by the change in collector current normalized to the minimum value as provided by the following formula: MC= $[I^P_C - I^{AP}_C]/I^{AP}_C$, where P and AP indicate the parallel and antiparallel state of the spin valve, respectively. Since these types of devices have small output currents due to the small differences between the two Schottky barrier heights of the semiconductor, MTT and double tunnel embodiments are generally preferred.

In FIG. 2, a cross-sectional view of a conventional TTM 200 of the MTT type is shown. TTM 200 of FIG. 2 has a base region 215, a semiconductor collector substrate 220 which is adjacent base region 215, an emitter region 205, and a barrier region 210 which separates emitter region 205 from base region 215. Base region 215, barrier region 210, and emitter region 205 form a sensor stack structure 201 of TTM 200. A first Schottky barrier 211 is formed at the interface between base region 215 and semiconductor collector substrate 220. Also, a second tunnel barrier 212 is formed within sensor stack structure 201 at the interface between emitter region 205 and base region 215 at barrier layer 210 in a single deposition step. An emitter conductive via 235 is formed adjacent emitter region 205 of sensor stack structure 201, a collector conductive via 236 is formed adjacent semiconductor collector substrate 220, and a base conductive via 234 is formed by etching the sensor stack layer structure down to base region 215. Insulator materials 250 surround the various structures of TTM 200.

In FIG. 3, a cross-sectional view of an alternative conventional TTM 300 of the SVT type is shown. TTM 300 of FIG. 3 has a base region 315, a semiconductor collector substrate 320 which is adjacent base region 315, an emitter region 305, and a barrier region 310 which separates emitter region 305 from base region 315. Base region 315, barrier region 310, and emitter region 305 form a sensor stack structure 301 of TTM 300. A first Schottky barrier 311 is formed at the interface between base region 315 and semiconductor collector substrate 320 to define the geometry of base region 315. Also, a second tunnel barrier 312 is formed at least partly over base region 315 at barrier layer 310 to therefore form emitter region 305 with an ex-situ process. An emitter conductive via 335 is formed adjacent emitter region 305 of sensor stack structure 301, and a collector conductive via 336 is formed adjacent semiconductor collector substrate 320. A base conductive via 334 is formed by etching the sensor stack structure down to base region 315. Insulator materials 350 surround the various structures of TTM 300.

Sensor stack structures are fragile and may be susceptible to damage due to ion bombardment and chemical exposure during manufacturing steps such as those used in the formation of conductive vias for connecting TTM base regions to their terminals. Metal layers involved in TTMs are generally within 5 nm and 10 nm thick, such that subtractive processes usually required to shape these devices can change the magnetic properties of the metal layers. Furthermore, in conventional TTMs 200 and 300 of FIGS. 2 and 3, base regions 215 and 315 are formed relatively longer than their respective emitter regions 205 and 305. This difference in length is necessary to facilitate the formation of base region conductive vias 234 and 334 while avoiding damage to sensor stack structures 201 and 301 associated with ion bombardment and chemical exposure. As a result, the trackwidths are unnecessarily large due to the relatively long length of the base regions. It is advantageous to form very thin and narrow base regions in TTMs for increased areal recording densities and smaller trackwidths.

Accordingly, there is a need to solve these and other problems so that TTMs may be suitable for use in magnetic heads and other devices.

SUMMARY

A three terminal magnetic sensing device (TTM) having a trackwidth defined in a localized region by a patterned insulator, and methods of making the same, are disclosed. In one illustrative example, one or more first sensor layers are formed over a collector substrate. A patterned insulator which defines a central opening exposing a top layer of the one or more first sensor layers is subsequently formed. The central opening has a width for defining a trackwidth (TW) of the TTM. Next, one or more second sensor layers are formed over the top layer of the one or more first sensor layers through the central opening of the patterned insulator. Preferably, the one or more second sensor layers include a tunnel barrier layer formed in contact with the top layer of the one or more first sensor layers.

Various embodiments and techniques are provided. In one embodiment, the collector substrate is formed with an elevated region surrounded by first and second recessed regions. First and second base lead layers are then formed in the first and the second recessed regions, respectively, followed by the formation of first and second hard bias structures over the first and the second base lead layers, respectively. The one or more first sensor layers includes a tunnel barrier layer formed over the collector substrate in the elevated region and over the first and second base lead layers, and the top layer of the one or more first sensor layers is a ferromagnetic free layer formed over the tunnel barrier layer. The ferromagnetic free layer has first and second ends which make electrical contact with the first and the second hard bias structures. The one or more second sensor layers include a second tunnel barrier layer formed over the top layer comprising the ferromagnetic free layer, and a ferromagnetic pinned layer formed over the second tunnel barrier layer.

In another embodiment, the one or more first sensor layers includes a first ferromagnetic layer formed over the collector substrate, a first tunnel barrier layer formed over the first ferromagnetic layer, and a second ferromagnetic layer (i.e. the top layer) formed over the first tunnel barrier layer. A cap layer is formed over the second ferromagnetic layer. After the patterned insulator is formed, cap layer materials exposed via the central opening of the patterned insulator are etched away to thereby expose the top layer of the one or more first sensor layers (i.e. the second ferromagnetic layer). The one or more second sensor layers includes a second tunnel barrier layer formed over the top layer of the one or more first sensor layers and a third ferromagnetic layer formed over the second tunnel barrier layer.

BRIEF DESCRIPTION OF THE DRAWINGS

Other objects and advantages of the invention will become more apparent to those skilled in the art after considering the following detailed description in connection with the accompanying drawings.

DETAILED DESCRIPTION OF THE PREFERRED EMBODIMENTS

Figure 1:
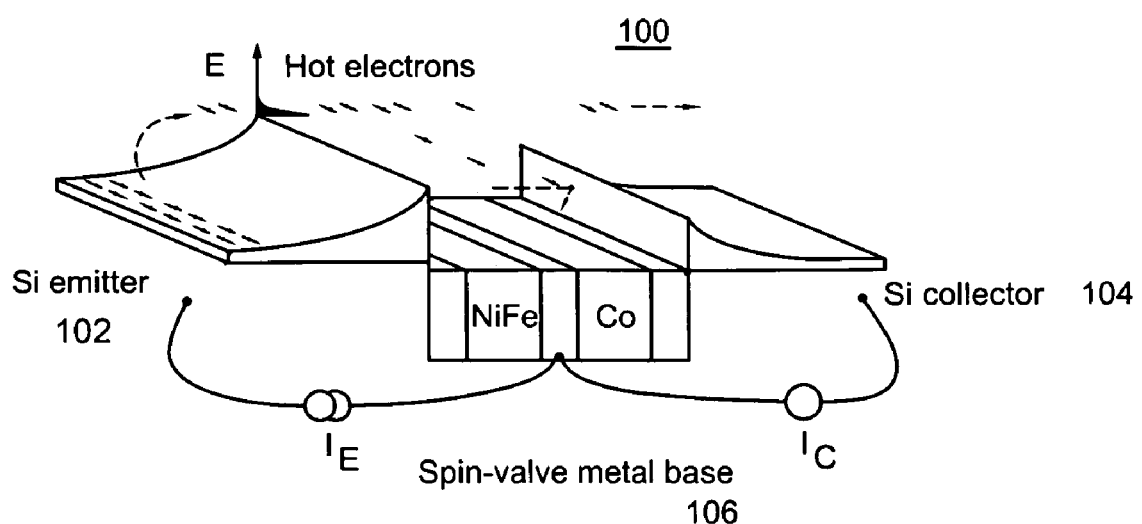
FIG. 1 is an illustration of a prior art three terminal magnetic sensing device (TTM) operation.
Figure 2:
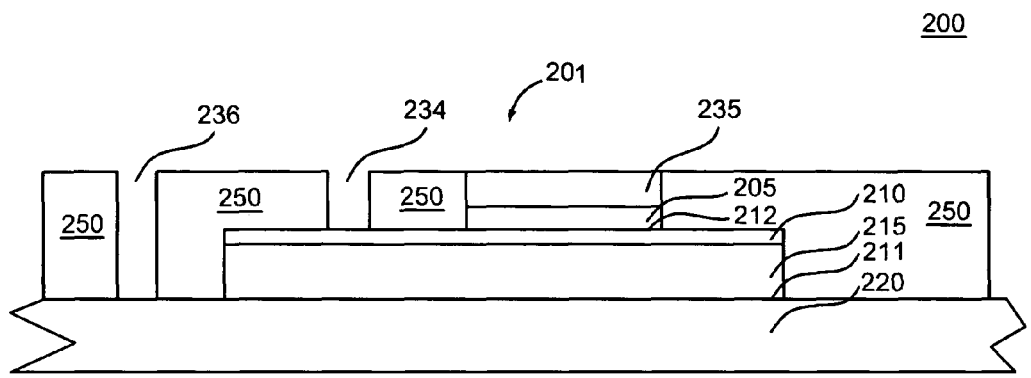
FIG. 2 is a cross-sectional view of a prior art magnetic head having a TTM.
Figure 3:
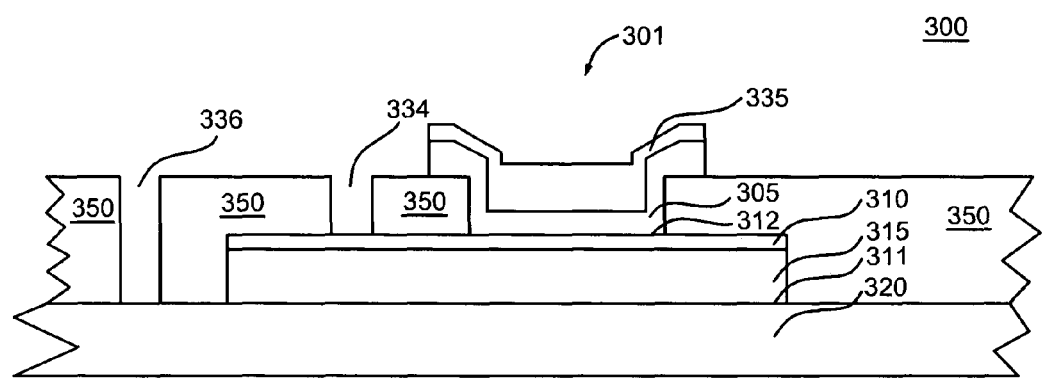
FIG. 3 is a cross-sectional view of a prior art magnetic head having a TTM.

According to the present disclosure, a three terminal magnetic sensing device (TTM) having a trackwidth defined in a localized region by a patterned insulator, and methods of making the same, are disclosed. In one illustrative example, one or more first sensor layers are formed over a collector substrate. A patterned insulator which defines a central opening exposing a top layer of the one or more first sensor layers is subsequently formed. The central opening has a width for defining a trackwidth (TW) of the TTM. Next, one or more second sensor layers are formed over the top layer of the one or more first sensor layers through the central opening of the patterned insulator. Preferably, the one or more second sensor layers include a tunnel barrier layer formed in contact with the top layer of the one or more first sensor layers.

Various embodiments and techniques are provided. In one embodiment, the collector substrate is formed with an elevated region surrounded by first and second recessed regions. First and second base lead layers are then formed in the first and the second recessed regions, respectively, followed by the formation of first and second hard bias structures over the first and the second base lead layers, respectively. The one or more first sensor layers includes a tunnel barrier layer formed over the collector substrate in the elevated region and over the first and second base lead layers, and the top layer of the one or more first sensor layers is a ferromagnetic free layer formed over the tunnel barrier layer. The ferromagnetic free layer has first and second ends which make electrical contact with the first and the second hard bias structures. The one or more second sensor layers include a second tunnel barrier layer formed over the top layer comprising the ferromagnetic free layer, and a ferromagnetic pinned layer formed over the second tunnel barrier layer. In another embodiment, the one or more first sensor layers includes a first ferromagnetic layer formed over the collector substrate, a first tunnel barrier layer formed over the first ferromagnetic layer, and a second ferromagnetic layer (i.e. the top layer) formed over the first tunnel barrier layer. A cap layer is formed over the second ferromagnetic layer. After the patterned insulator is formed, cap layer materials exposed via the central opening of the patterned insulator are etched away to thereby expose the top layer of the one or more first sensor layers (i.e. the second ferromagnetic layer). The one or more second sensor layers includes a second tunnel barrier layer formed over the top layer of the one or more first sensor layers and a third ferromagnetic layer formed over the second tunnel barrier layer.

The following description is an exemplary embodiment for carrying out techniques of the present disclosure. This description is made for the purpose of illustrating the general principles of the present disclosure and is not meant to limit the inventive concepts claimed herein.

Figure 4:
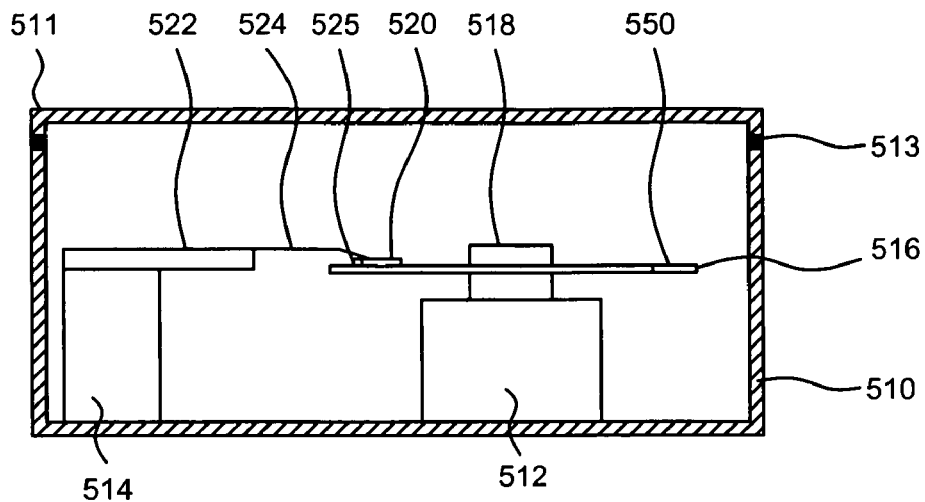
FIG. 4 is a cross-sectional view of a magnetic head of a disk drive which may embody a TTM having a trackwidth defined in a localized region by a patterned insulator.
Figure 5:
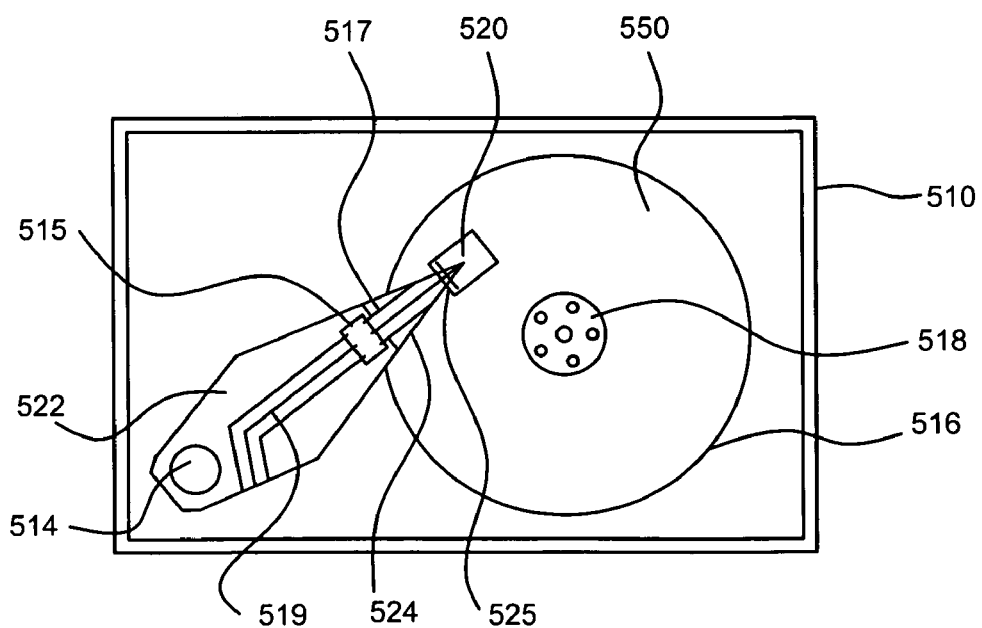
FIG. 5 is a top-down view of the disk drive of FIG. 4.

FIG. 4 is a simplified block diagram of a conventional magnetic recording disk drive for use with a three terminal magnetic sensing device (TTM) of a magnetic head. FIG. 5 is a top view of the disk drive of FIG. 4 with the cover removed. Referring first to FIG. 4, there is illustrated in a sectional view a schematic of a conventional disk drive of the type using a TTM. The disk drive comprises a base 510 to which are secured a disk drive motor 512 and an actuator 514, and a cover 511. Base 510 and cover 511 provide a substantially sealed housing for the disk drive. Typically, there is a gasket 513 located between base 510 and cover 511 and a small breather port (not shown) for equalizing pressure between the interior of the disk drive and the outside environment. A magnetic recording disk 516 is connected to drive motor 512 by means of a hub 518 to which it is attached for rotation by drive motor 512. A thin lubricant film 550 is maintained on the surface of disk 516. A read/write head or transducer 525 is formed on the trailing end of a carrier, such as an air-bearing slider 520. Transducer 525 is a read/write head comprising an inductive write head portion and a read head portion. Slider 520 is connected to actuator 514 by means of a rigid arm 522 and a suspension 524. Suspension 524 provides a biasing force which urges slider 520 onto the surface of the recording disk 516. During operation of the disk drive, drive motor 512 rotates disk 516 at a constant speed, and actuator 514, which is typically a linear or rotary voice coil motor (VCM), moves slider 520 generally radially across the surface of disk 516 so that read/write head 525 may access different data tracks on disk 516.

FIG. 5 illustrates in better detail suspension 524 which provides a force to slider 520 to urge it toward disk 516. Suspension 524 may be a conventional type of suspension, such as the well-known Watrous suspension, as described in U.S. Pat. No. 4,167,765. This type of suspension also provides a gimbaled attachment of the slider which allows the slider to pitch and roll as it rides on the air bearing surface. The data detected from disk 516 by transducer 525 is processed into a data readback signal by signal amplification and processing circuitry in an integrated circuit chip 515 located on arm 522. The signals from transducer 525 travel via a flex cable 517 to chip 515, which sends its output signals to the disk drive electronics (not shown) via cable 519.

Figure 6:
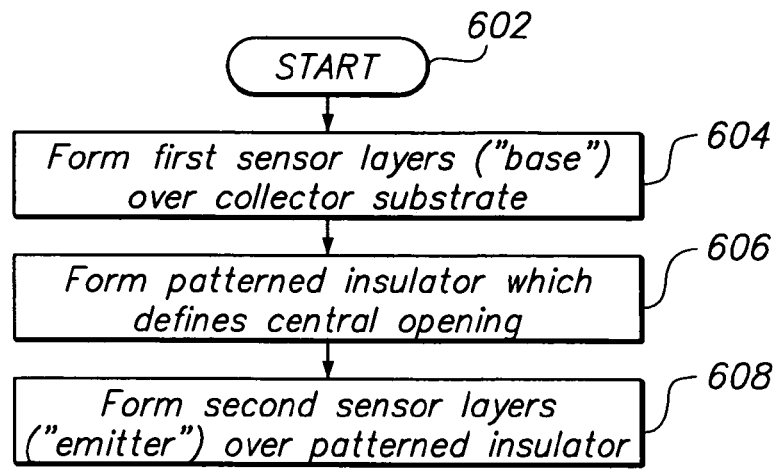
FIG. 6 is a flowchart which describes a general fabrication process for a TTM having a trackwidth defined in a localized region by a patterned insulator.

FIG. 6 is a flowchart which describes a general fabrication process for an exemplary sensor or TTM of the present disclosure. Beginning at a start block 602 of FIG. 6, one or more first sensor layers are formed over a "collector" or collector substrate (step 604 of FIG. 6). The one or more first sensor layers may be or include a "base" or base region of the TTM. Next, a patterned insulator which defines a central opening exposing a top layer of the one or more first sensor layers is then formed (step 606 of FIG. 6). The central opening has a width for defining a trackwidth (TW) of the TTM. Next, one or more second sensor layers are formed over the top layer of the one or more first sensor layers through the central opening of the patterned insulator (step 608 of FIG. 6). Preferably, the one or more second sensor layers include a tunnel barrier layer formed in contact with the top layer of the one or more first sensor layers. Additional processing steps may be subsequently performed to complete the manufacture of the TTM.

Various embodiments and techniques for fabricating TTMs in accordance with FIG. 6 are provided. To illustrate, FIGS. 7-22 are a series of illustrations of partially-fabricated TTM structures provided in preferred order for a first specific fabrication process for a TTM. In addition, FIGS. 23-29 are a series of illustrations of partially-fabricated sensor structures provided in preferred order for a second specific fabrication process for a sensor/TTM.

Figure 7:
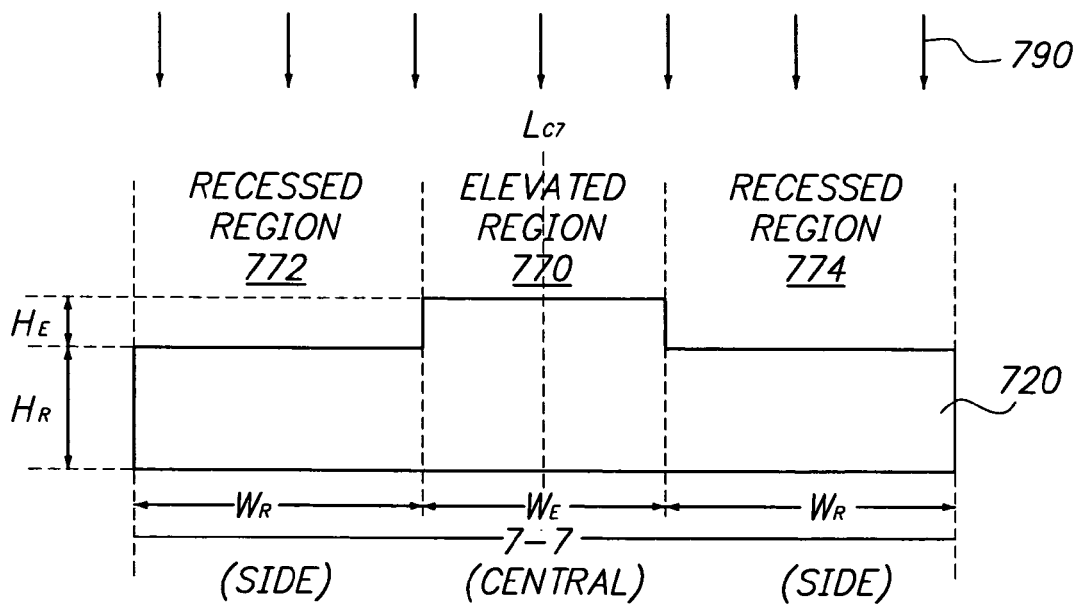
FIG. 7 is the first in a series of illustrations of FIGS. 7-22 of partially-fabricated TTM structures provided in preferred order for a first specific fabrication process for a TTM, showing a collector substrate having an elevated region and first and second recessed regions adjacent the elevated region, where the elevated region is in a central region and the first and second recessed regions are in first and second side regions, respectively.

The first fabrication process of FIGS. 7-22 will now be described. In FIG. 7, a collector substrate 720 having an elevated region 770 and first and second recessed regions 772 and 774 adjacent elevated region 770 is provided. Collector substrate 720 may be referred to as a "collector" or collector region of the TTM. Collector substrate 720 may be made of a wafer of any suitable semiconductor material such as silicon (Si), gallium arsenide (GaAs), or other. Collector substrate 720 may be made by forming a resist structure over a central region of a collector substrate which exposes collector substrate materials over first and second side regions of the collector substrate. With the resist structure in place, an etching process is performed to remove the exposed collector substrate materials to thereby form elevated region 770 and recessed regions 772 and 774. This etching process may be a wet etching process, a reactive ion etching (RIE) process, an ion milling process, or any other suitable removal process. The resist structure is then removed.

The resist structure may be or include a photoresist. The resist structure may be a monolayer resist or a multi-layered resist (e.g. bilayer or trilayer resist). If photolithography is used to form the resist structure, a thin film of resist is light-exposed in regions which are to be removed, provided the resist is a positive resist. If the resist is a negative resist, it is light-exposed in regions that are to be retained. The resist is then subjected to a basic developer solution for its formation.

Note that, in the present technique, the resist structure is formed over the central region so as to define a width WE for subsequently-formed elevated region 770. Width WE of elevated region preferably is 100 nanometers (nm), but may alternatively be within 10 nm and 500 nm. A height HE of elevated region preferably is about 100 nm, but may alternatively be within 10 nm and 200 nm. Thus, elevated region 770 is formed on collector substrate 720 (which is at a centerline $L_{C7}$ of the width of collector substrate 720 and the trackwidth of the resulting TTM).

Figure 8:
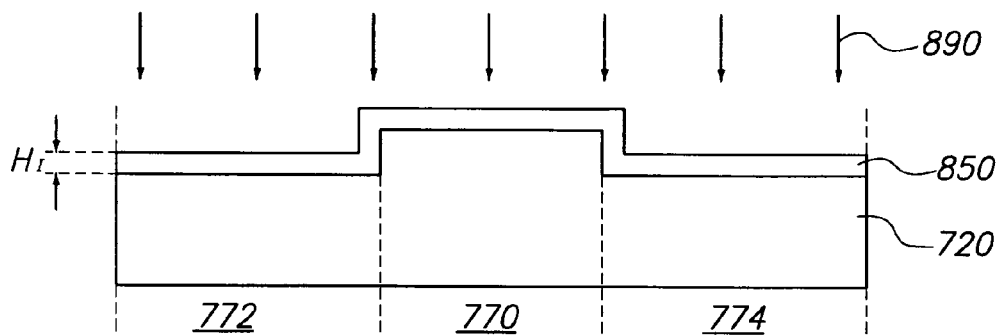
FIG. 8 is the second in the series of illustrations of FIGS. 7-22 of the partially-fabricated TTM structures, which is the same as that shown in FIG. 7 except that an insulator layer is formed in full-film over the collector substrate.

Next, a formation process 790 is performed in-situ to deposit insulator materials in full-film over and in contact with collector substrate 720. The result is shown in FIG. 8, showing an insulator layer 850 formed to a thickness $H_I$. Preferably, insulator layer 850 is sputter deposited on top of collector substrate 720. Alternatively, other suitable deposition techniques may be used, such as ion beam sputtering, evaporation, atomic layer deposition, or chemical vapor deposition. In this exemplary embodiment, insulator layer 850 is made of alumina ($Al_2O_3$), but alternatively may be made with any suitable insulator material such as silicon dioxide ($SiO_2$), silicon nitride ($Si_3N_4$), aluminum nitride (AlN), zirconium oxide ($ZrO_2$), hafnium oxide ($HfO_x$), and yttrium oxide ($Y_2O_3$). Thickness $H_I$ of insulator layer 850 preferably is about 30 nm, but may alternatively be within 20 nm and 50 nm.

Figure 9:
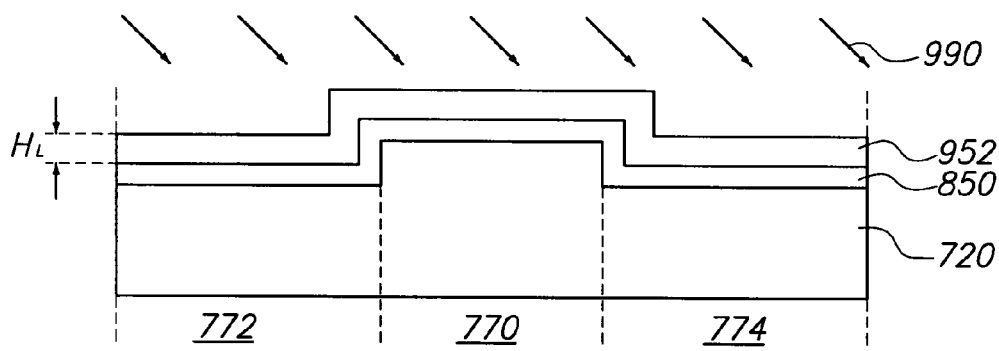
FIG. 9 is the third in the series of illustrations of FIGS. 7-22 of the partially-fabricated TTM structures, which is the same as that shown in FIG. 8 except that a base lead layer is formed in full-film over the insulator layer.

In FIG. 8, a formation process 890 is then performed in-situ to deposit base lead materials in full-film over insulator layer 850 and in-plane with semiconductor materials of elevated region 770 of collector substrate 720. The result is shown in FIG. 9, where a base lead layer 952 is formed to a thickness $H_L$. Preferably, base lead layer 952 is sputter deposited on top of insulator layer 850. Alternatively, other suitable deposition techniques may be used, such as ion beam sputtering, evaporation, or chemical vapor deposition. In this exemplary embodiment, base lead layer 952 is made of a non-magnetic electrically conductive material such as copper (Cu), but alternatively may be made with any suitable electrically conductive metallic, alloyed or semiconducting non-magnetic material. Thickness $H_L$ of base lead layer 952 preferably is about 40 nm, but may alternatively be within 20 nm and 100 nm. Note that base lead layer 952 is formed in recessed regions 772 and 774 in-plane with semiconductor materials of semiconductor substrate 720.

Figure 10:
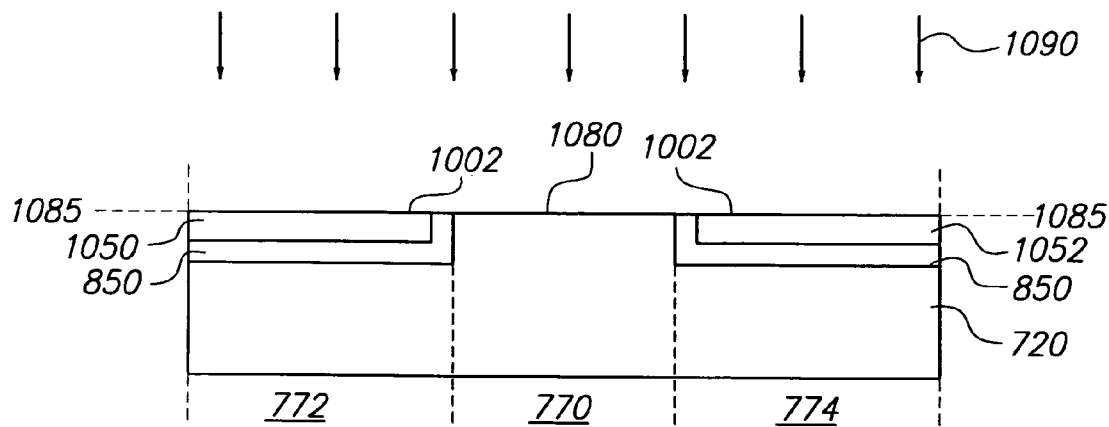
FIG. 10 is the fourth in the series of illustrations of FIGS. 7-22 of the partially-fabricated TTM structures, which is the same as that shown in FIG. 9 except that the insulator materials and base lead materials formed over the elevated region are removed, and the base lead materials are shown to be formed in-plane with semiconductor materials of the elevated region.
Figure 11:
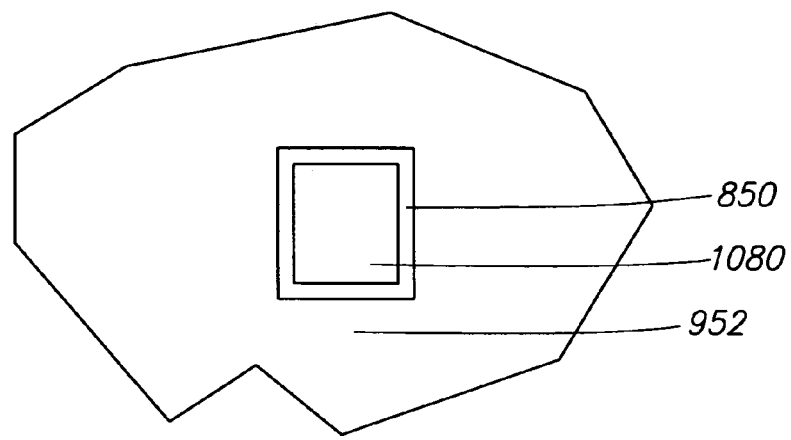
FIG. 11 is the fifth in the series of illustrations of FIGS. 7-22 of the partially-fabricated TTM structures, showing a top down view of that shown and described in relation to FIG. 10.
Figure 12:
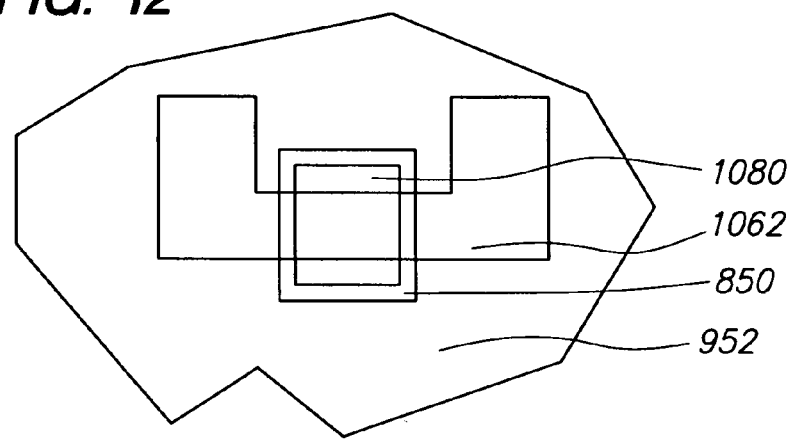
FIG. 12 is the sixth in the series of illustrations of FIGS. 7-22 of the partially-fabricated TTM structures, showing a top down view of a resist layer applied to the TTM structure shown in FIG. 10.
Figure 13:
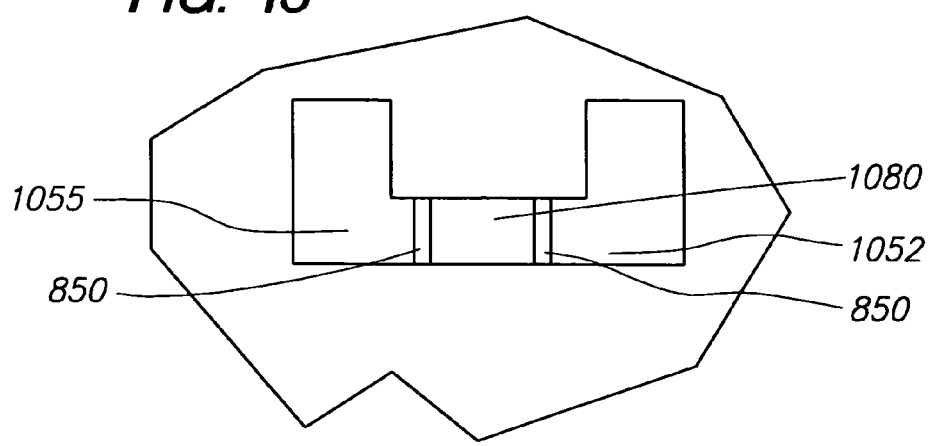
FIG. 13 is the seventh in the series of illustrations of FIGS. 7-22 of the partially-fabricated TTM structures, showing a top down view of a base lead pattern shape after subtractive processing and resist removal.

Next in FIG. 9, a planarization process 990 such as a chemical mechanical polishing (CMP) process is performed in-situ to remove the insulator materials of insulator layer 850 and base lead materials of base lead layer 952 in elevated region 770. The result is shown in FIG. 10, where the CMP process planarizes portions of the materials so as to form a planarized surface 1085 and exposes a top surface 1080 of elevated region 770. See also the top down view shown in FIG. 11. Base lead layers 1050 and 1052 are now defined in recessed regions 772 and 774, respectively. Base lead layers 1050 and 1052 are electrically insulated or isolated from the underlying collector substrate 720. Note that the process further exposed first and second top surfaces/ends 1002 of base lead layers 1050 and 1052. In this exemplary embodiment, top surfaces 1002 of base lead layers 1050 and 1052 are formed coplanar with top surface 1080 of elevated region 770. The lateral extent of base lead layer 952 (e.g. FIG. 11) to form base lead layers 1050 and 1052 (e.g. FIG. 13) is formed first by applying, exposing, and developing a (photo) resist layer 1062 as shown in the top view of FIG. 12. Such steps are followed by a subtractive removal of base lead material 952 and collector substrate material in elevated region 770 with top surface 1080, with the result shown in the top view of FIG. 13.

The CMP process may be performed with a conformable polishing pad in conjunction with a chemical slurry. The pad is passed over the work-in-progress to perform the polishing. This type of polishing typically provides a higher material removal rate and a higher chemical selectivity in relation to the insulator and base lead materials than that of collector substrate 720. The amount of insulator and base lead materials removed at any location on the work-in-progress is a direct function of the cumulative movement of the polishing pad over the substrate surface, the pressure at the substrate/polishing pad interface, and the slurry. Where all other factors remain unchanged, the greater the cumulative movement between the substrate and the polishing pad, the greater the amount of material removed from the substrate surface.

Note that any alternative suitable removal process, such as a wet etching process, a reactive ion etching (RIE) process, or an ion milling process may be utilized in lieu of the CMP process in order to remove materials from top surface 1080 of elevated region 770.

Figure 14:
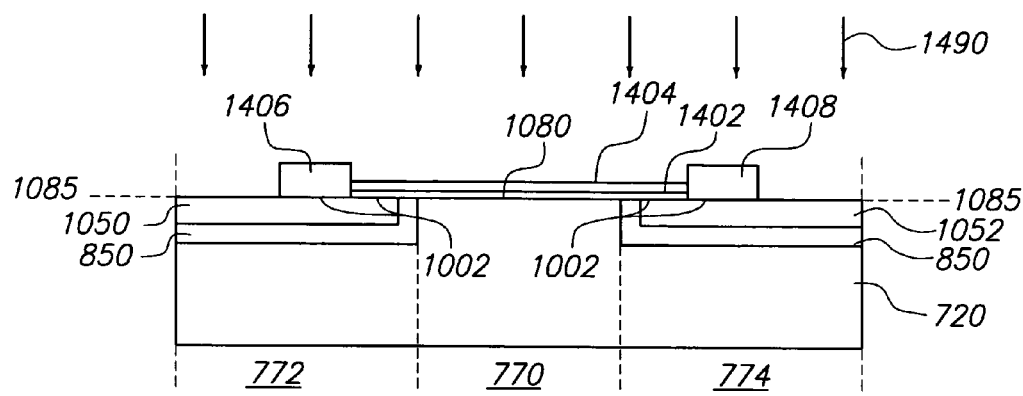
FIG. 14 is the eight in the series of illustrations of FIGS. 7-22 of the partially-fabricated TTM structures, which is the same as that shown in FIG. 10 except that a first tunnel (or Schottky) barrier layer and a ferromagnetic free layer are formed over the collector substrate, and first and second hard bias structures are formed over ends of the first and the second base leads and in contact with the ferromagnetic free layer.

Next in FIG. 14, a formation process 1490 is used to form a first tunnel (or Schottky) barrier layer 1402, a ferromagnetic (FM) free layer 1404, and hard bias structures 1406 and 1408 over the structure, preferably in that order. Conventional deposition and lithography techniques may be utilized in such formation process 1490. First tunnel barrier layer 1402 is made of a non-magnetic insulating material, preferably made of $Al_2O_3$, which is e.g. generally less than 1 nm in thickness. As shown in FIG. 14, first tunnel barrier layer 1402 makes contact with top surface 1080 of collector region 720 in elevated region 770. First tunnel barrier layer 1402 also makes contact with top surfaces 1002 of base lead layers 1050 and 1052 underneath it.

FM free layer 1404 is formed on top of first tunnel barrier layer 1402, and therefore it is in electrical contact with base lead layers 1050 and 1052. FM free layer 1404 may be referred to as the "base" or base region of the TTM. FM free layer 1404 preferably includes at least one soft ferromagnetic (FM) material, such as nickel-iron (NiFe), cobalt-iron (CoFe), or cobalt (Co), as well as a very thin metal (e.g. Cu) which is formed within the FM materials. In an alternate embodiment, FM free layer 1404 is formed in direct contact with its underlying base lead layers 1050 and 1052. FM free layer 1404 also has first and second ends which are in direct physical contact with hard bias structures 1406 and 1408, respectively. Hard bias structures 1406 and 1408 are utilized to provide a hard biasing of FM free layer 1404, and may be referred to as hard magnets. Hard bias structures 1406 and 1408 may be made of any suitable magnetic material, such as a cobalt-based material such as cobalt-platinum-chromium.

Figure 15:
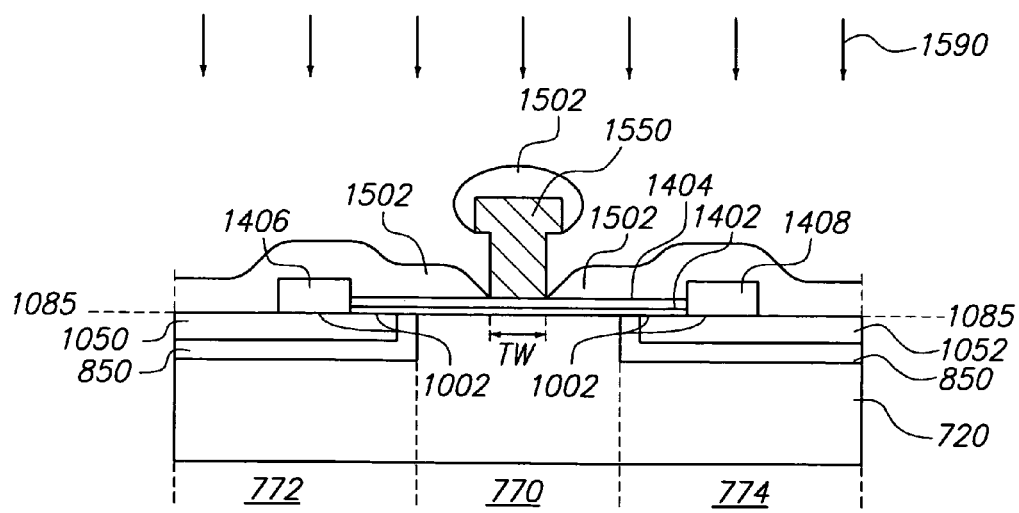
FIG. 15 is the ninth in the series of illustrations of FIGS. 7-22 of the partially-fabricated TTM structures, which is the same as that shown in FIG. 14 except that a resist structure is formed in the central region over the ferromagnetic free layer and an insulator materials are deposited over the structure.

Localization of ballistic electrons, and hence signal sensitivity, is achieved by forming an ex-situ tunnel barrier junction. To initiate this process, a resist structure 1550 of FIG. 15 is formed in the central region of the structure. Resist structure 1550 is formed so as to cover a top surface portion of FM free layer 1404 in the central region. Resist structure 1550 may be or include a photoresist. Resist structure 1550 may be a monolayer resist or a multi-layered resist (e.g. bilayer or trilayer resist). In FIG. 15, resist structure 1550 is shown as forming a T-shape. If photolithography is used to form resist structure 1550, a thin film of resist is light-exposed in regions which are to be removed, provided the resist is a positive resist. If the resist is a negative resist, it is light-exposed in regions that are to be retained. The resist is then subjected to a basic developer solution for the final formation of resist structure 1550.

Next, a formation process 1590 is performed to deposit insulator materials in full-film over and in contact with the structure. The result is shown in FIG. 15, where an insulator 1502 is formed over FM free layer 1404, hard bias structures 1406 and 1408, and resist structure 1550. Preferably, insulator 1502 is sputter deposited on top of the structure. Alternatively, other suitable deposition techniques may be used, such as ion beam sputtering, evaporation, atomic layer deposition, or chemical vapor deposition. In this exemplary embodiment, insulator 1502 is made of alumina ($Al_2O_3$), but alternatively may be made with any suitable insulator material such as silicon dioxide ($SiO_2$), silicon nitride ($Si_3N_4$), aluminum nitride (AlN), zirconium oxide ($ZrO_2$), hafnium oxide ($HfO_x$), and yttrium oxide ($Y_2O_3$).

Figure 16:
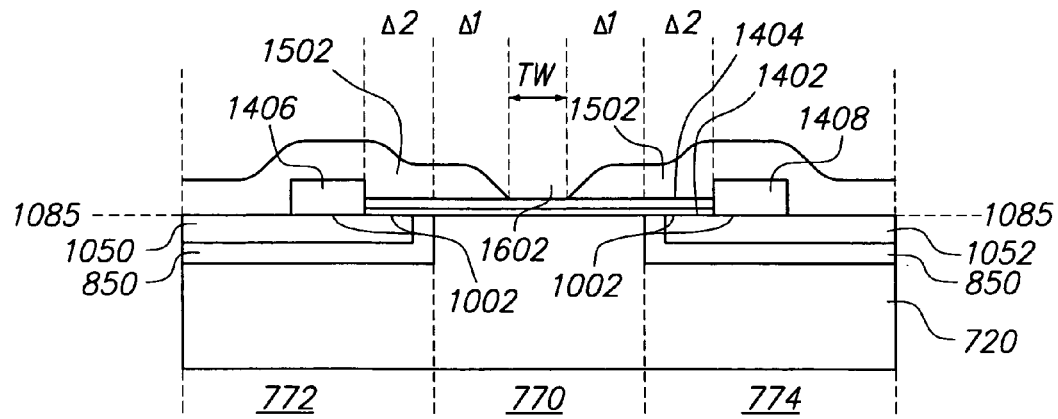
FIG. 16 is the tenth in the series of illustrations of FIGS. 7-22 of the partially-fabricated TTM structures, which is the same as that shown in FIG. 15 except that the resist structure is removed to reveal that a patterned insulator is formed over the end regions with a central opening which exposes the ferromagnetic free layer and defines a trackwidth for the TTM.

Resist structure 1550 is then removed, revealing the structure shown in FIG. 16. As shown, the insulator has been patterned to form a patterned insulator 1502 over the structure. Insulator materials of patterned insulator 1550 are formed in the side regions and partially extend over into the central region, so as to define a central opening 1602 which exposes a top of FM free layer 1404. See also the top down view shown in FIG. 18. The width of central opening 1602 will define a trackwidth (TW) for the TTM. Preferably, central opening 1602 shown in FIG. 16 (and hence the TW) has a width that is substantially equal to a distance between the left edge of central opening 1602 (i.e. the left TW edge) and the left edge of elevated region 770 of collector substrate 720 (see leftmost "Δ1" in FIG. 16). Similarly, the width of central opening 1602 (and hence the TW) is substantially equal to a distance between the right edge of central opening 1602 (i.e. the right TW edge) and the right edge of elevated region 770 of central opening 1602 (see rightmost "Δ1" in FIG. 16). Also preferably, the width of central opening 1602 (and hence the TW) is substantially equal to a distance between the left edge of elevated region 770 and the left edge of hard bias structure 1406 (see leftmost "Δ2" in FIG. 16). Similarly, the width of central opening 1602 (and hence the TW) is substantially equal to a distance between the right edge of elevated region 770 and the right edge of hard bias structure 1408 (see rightmost "Δ2" in FIG. 16).

Figure 17:
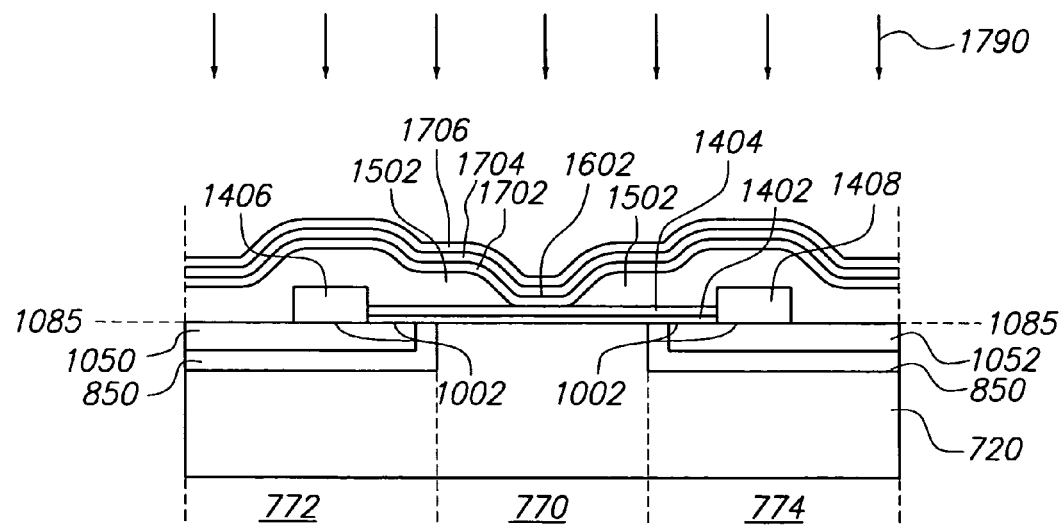
FIG. 17 is the eleventh in the series of illustrations of FIGS. 7-22 of the partially-fabricated TTM structures, which is the same as that shown in FIG. 16 except that a second tunnel barrier layer is formed over the ferromagnetic free layer through the central opening of the patterned insulator, followed by the formation of a ferromagnetic pinned layer and an antiferromagnetic layer.
Figure 18:
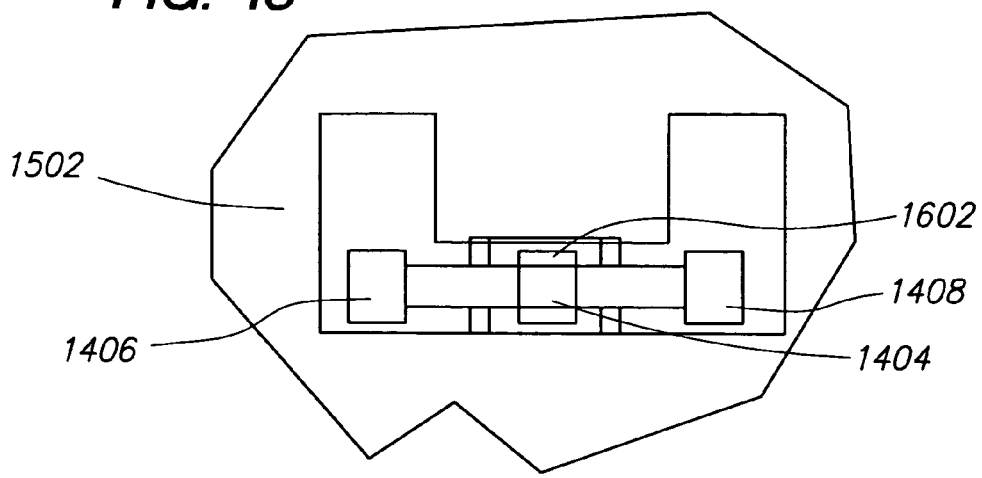
FIG. 18 is the twelfth in the series of illustrations of FIGS. 7-22 of the partially-fabricated TTM structures, showing a top down view of that shown and described in relation to FIG. 16.
Figure 19:
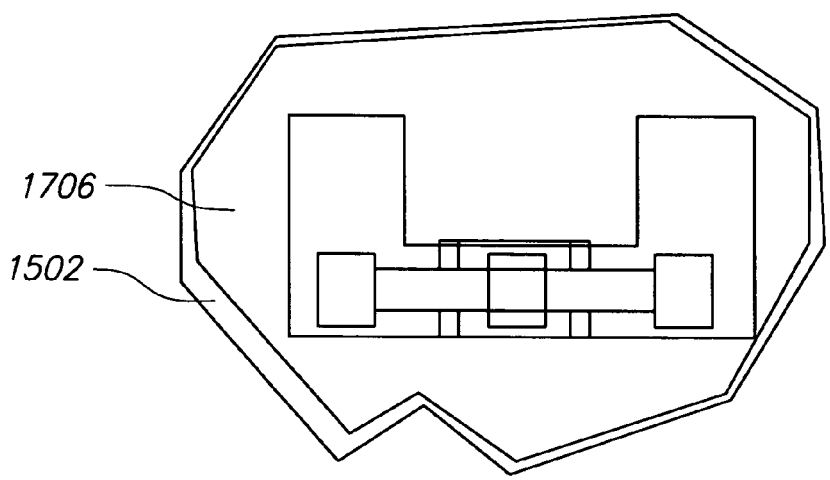
FIG. 19 is the thirteenth in the series of illustrations of FIGS. 7-22 of the partially-fabricated TTM structures, showing a top down view of that shown and described in relation to FIG. 17.

In FIG. 17, a formation process 1790 is used to form a second tunnel barrier layer 1702, a ferromagnetic (FM) pinned layer 1704, and an antiferromagnetic (AFM) pinning layer 1706 over the structure, preferably in that order. See also the top down view shown in FIG. 19. Conventional deposition (e.g. deposition in full-film), as well as lithography techniques, may be utilized in such formation process 1790. As shown in FIG. 17, a central portion of second tunnel barrier layer 1702 makes contact with the exposed top surface of FM free layer 1404 through central opening 1602 but is otherwise insulated therefrom by patterned insulator 1502. Like first tunnel barrier layer 1402, second tunnel barrier layer 1702 may be made of a non-magnetic insulating material, preferably made of $Al_2O_3$, which is e.g. generally less than 1 nm in thickness.

Also in FIG. 17, FM pinned layer 1704 is formed over and in contact with second tunnel barrier layer 1702. Similarly, AFM pinning layer 1706 is formed over and in contact with FM pinned layer 1704. FM pinned layer 1704 and AFM pinning layer 1706 together may be referred to as the "emitter" or emitter region of the TTM. Note that FM pinned layer 1704 is electrically insulated and isolated from hard bias structures 1406 and 1408 by patterned insulator 1502. In SVT configurations, the emitter region preferably includes metallic materials such as Ta or Au. In MTT configurations, the emitter region preferably includes at least one magnetic material such as NiFe, CoFe, or Co. The emitter region is generally formed to a thickness within 4 nm and 20 nm.

Figure 20:
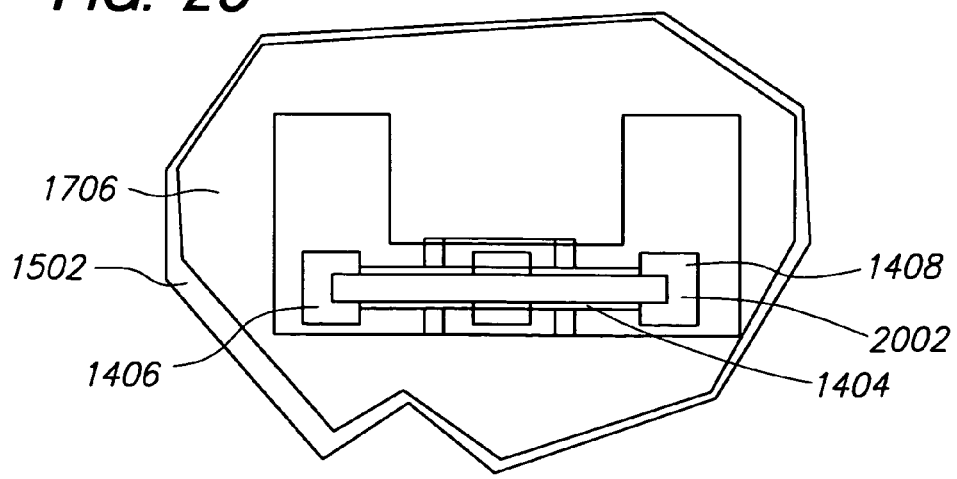
FIG. 20 is the fourteenth in the series of illustrations of FIGS. 7-22 of the partially-fabricated TTM structures, showing a resist structure formed in the central region and the side regions to further define the TTM by etching.
Figure 21:
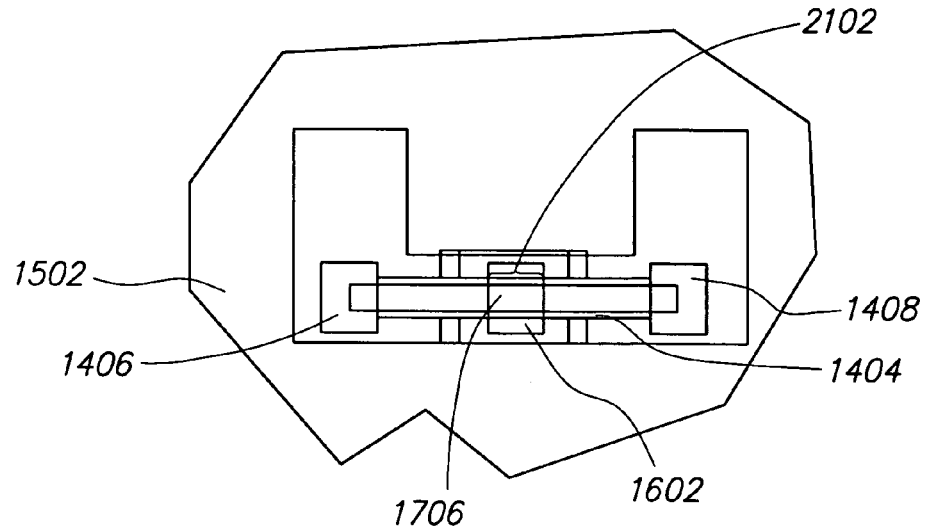
FIG. 21 is the fifteen in the series of illustrations of FIGS. 7-22 of the partially-fabricated TTM structures, showing the etched structure with the resist structure removed, the etched structure including the etched antiferromagnetic layer, the etched ferromagnetic pinned layer, the etched second tunnel barrier layer, the etched ferromagnetic free layer, and the etched first tunnel barrier layer.

Next in the top down view of FIG. 20, a resist structure 2002 is formed so as to cover a portion of the sensor stack structure in the central region and extend outwards toward the side regions so as to cover portions of hard bias structures 1406 and 1408. Again, resist structure 2002 may be or include a photoresist. Resist structure 2002 may be a monolayer resist or a multi-layered resist (e.g. bilayer or trilayer resist). An etching process is then performed over the structure of FIG. 20, so as to remove portions of sensor stack materials left exposed by resist structure 2002. More particularly, the etching process removes exposed portions of sensor materials so as to define a rear edge 2102 of the sensor stack structure as shown in the top down view of FIG. 21. Thus, rear edges of FM pinned layer 1704 and FM free layer 1404 are defined in such etching process so as to be self-aligned.

Figure 22:
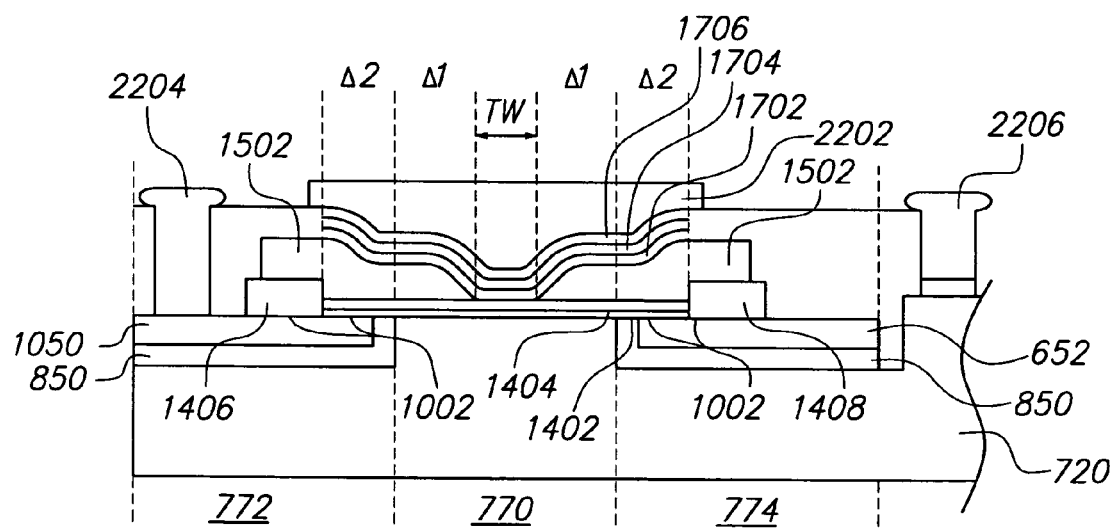
FIG. 22 is the sixteenth and final illustration in the series of FIGS. 7-22 of the partially-fabricated TTM structures, showing the TTM in a more completed form where emitter, base, and collector contacts are formed for the TTM.
Figure 23:
FIG. 23 is the first in a series of illustrations of FIGS. 23-29 of partially-fabricated sensor structures provided in preferred order for a second specific fabrication process for a sensor, showing a collector substrate having a first electrode and a cap layer formed thereover.

The resulting structure of a TTM 2250 is shown in the ABS view of FIG. 22. In FIG. 22, it is shown that an emitter conductive via 2202, a base conductive via 2204, and a collector conductive via 2206 are formed. Base conductive via 2204 has a first end which makes contact with base lead layer 1050 and a second end which is exposed at a top end of the TTM. To form base conductive via 2204, a via hole is formed in recessed region 772 to expose underlying base lead materials of base lead layer 1050. Conductive materials are then formed in the via hole to form base region conductive via 2204 coupled to the exposed base lead materials. Emitter conductive via 2202 has a first end which makes contact with the emitter and a second end which is exposed at the top end of the TTM. To form emitter conductive via 2202, conductive materials are simply deposited or otherwise formed at least partially over the emitter to form emitter conductive via 2202.

Collector conductive via 2206 has a first end which makes contact with collector substrate 720 and a second end which is exposed at the top end of the TTM. To form collector conductive via 2206, a via hole is formed in recessed region 774 to expose underlying collector substrate materials of collector substrate 720 adjacent the location of removed base lead materials. Conductive materials are then formed in the via hole to form collector conductive via 2206 coupled to the exposed collector substrate materials. To achieve suitable coupling, a doping process may be performed prior to the sensor formation at the via site for collector conductive via 2206 in recessed region 774. This doping process may specifically be performed just prior to the formation of the insulator layer described in relation to FIG. 8. This doping process is achieved either by a combination of solid state diffusion or ion-implantation and rapid thermal annealing. The dopant ions are made from any suitable chemical species to form a highly-doped n-type region in the semiconductor substrate. The highly-doped via site region helps provide a physical contact point for subsequently formed collector conductive via 2206.

Additional processing steps may be subsequently performed to complete the manufacture of the TTM. These processes may utilize any suitable techniques known in the art (conventional or otherwise) to complete the manufacturing per the design requirements. Also note that additional or alternative leads may be formed in the TTM, which has at least three leads. Furthermore, on-board electronics may be formed on collector substrate 720 near the sensor stack structure.

Again, the TW of TTM 2250 of FIG. 22 is preferably substantially equal to the distance between the left TW edge and the left edge of elevated region 770 of collector substrate 720 (see leftmost "Δ1" in FIG. 22). Similarly, the TW is substantially equal to the distance between the right TW edge and the right edge of elevated region 770 of central opening 1602 (see rightmost "Δ1" in FIG. 22). Also preferably, the TW is substantially equal to the distance between the left edge of elevated region 770 and the left edge of hard bias structure 1406 (see leftmost "Δ2" in FIG. 22). Similarly, the TW is substantially equal to the distance between the right edge of elevated region 770 and the right edge of hard bias structure 1408 (see rightmost "Δ2" in FIG. 22). Thus, magnetic stabilization is achieved by creating a contiguous junction between each hard bias structure 1406 and 1408 and FM free layer 1404 that is located a distance of Δ1+Δ2 away from the trackwidth edge.

Narrow trackwidth dimensions are achieved by requiring Δ1, Δ2, TW to be comparable in magnitude. Thus preferably, TW=Δ1=Δ2. In particular, each of these dimensions may be set at about 50 nanometers (nm), for example. Alignment of the trackwidth edge to the edge of elevated region 770 of collector substrate 720, the edge of hard bias structures 1404 and 1406 to the edge of elevated region 770 of collector substrate 720 of half of this value is achievable with a tolerance of 25 nm, for example. Scaling dimensions to 30 nm requires alignment tolerances of 15 nm, which is achievable though use of electron beam (e-beam) processes.

Thus, the TTM of FIG. 22 may include collector substrate 720, one or more first sensor layers formed over collector substrate 720; patterned insulator 1502 which defines a central opening; and one or more second sensor layers formed over patterned insulator 1502 and over top layer of the one or more first sensor layers through the central opening of patterned insulator 1502. The one or more first sensor layers may be layers 1402 and 1404. The top layer of the one or more first sensor layers may be or include FM free layer 1404 formed over collector substrate 720. The one or more second sensor layers may be layers 1702, 1704, and 1706.

TTM 2250 is suitable for incorporation into nanoscale devices which increase areal recording densities, therefore aiding the revolution in magnetic storage. During operation of TTM 2250, hot electrons are emitted from the emitter region to travel through to the base region to reach the collector region, which collects the magnetocurrent (i.e. collects the electrons). In operation, the device acts as a hot spin electron filter whereby the barrier region between the emitter and the base operates to selectively allow the hot electrons to pass on through to the base region and then on through the collector region. When TTM 2250 is not functioning, the device is in a known magnetic quiescent state. In this case, the magnetization of FM free layer 1402 which comprises all or part of the base region is parallel to the ABS plane. The direction of this magnetization depends on the direction of the magnetic field produced by a pinned layer (not visible) formed adjacent the free layer. The scattering of electrons within FM free layer 1402 is dependent upon the orientation of the magnetization within the free layer. For example, if the magnetization is pointing in the parallel direction relative to FM pinned layer 1704 (i.e. parallel to the ABS plane), then the electrons are not scattered as much as compared to the case where FM free layer 1402 is antiparallel relative to FM pinned layer 1704. The performance of the device may be different depending upon the relative configuration of the layers.

Thus, one or more of the following advantageous characteristics may be provided in a TTM: a means to stabilize FM free layer 1404; a means to confine ballistic electrons injected at the emitter to a localized region in FM free layer 1404; and a means to provide a low resistance path for measuring the base current. The stabilization scheme has hard bias structures 1406 and 1408 in direct electrical contact with FM free layer 1404, which extends well beyond the trackwidth region. An ex-situ process is utilized that localizes ballistic electron transport across tunnel barrier layer 1702 and electrically isolates hard bias structures 1406 and 1408 from FM pinned layer 1704.

The second fabrication process for a sensor/TTM of FIGS. 23-29 will now be described. A substrate 2302 is first provided. Substrate 2302 may be a collector substrate, made of a wafer of any suitable semiconductor material such as silicon (Si), gallium arsenide (GaAs), or other. In contrast to the method of FIGS. 7-22, collector substrate 2302 has a flat or substantially flat profile or top surface. A first electrode 2304 is formed (e.g. deposited in full film) over collector substrate 2302. Subsequently, a cap layer 2306 is formed (e.g. deposited in full film) over first electrode 2304. Preferably, cap layer 2306 is made of tantalum (Ta). Alternatively, cap layer 2306 may be or include materials such as Au, Cr, Au/Ta, Cr/Ta, or insulator materials such as alumina or silicon oxide.

Figure 24:
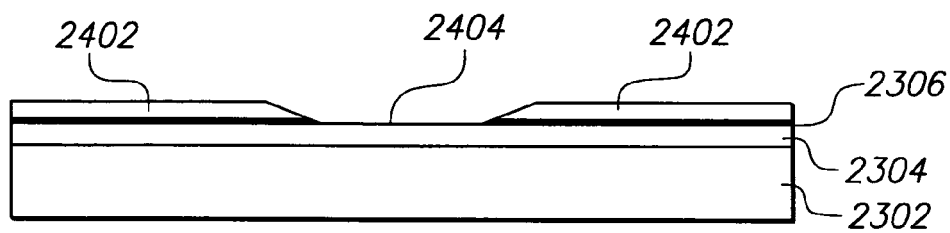
FIG. 24 is the second in the series of illustrations of FIGS. 23-29 of the partially-fabricated sensor structures, which is the same as that shown in FIG. 23 except that a patterned insulator is formed in the side regions and defines a central opening which exposes the cap layer and defines a trackwidth for the sensor.

In FIG. 24, a patterned insulator 2402 is then formed over the side regions of the structure so as to define a central opening which exposes a top surface 2404 of cap layer 2306. Patterned insulator 2402 may be made with use of a resist structure over cap layer 2306 in the central region, which exposes cap layer materials in the side regions. With the resist structure in place, insulator materials are deposited over the side regions (and over the resist structure in the central region), and the resist structure is then removed.

Figure 25:
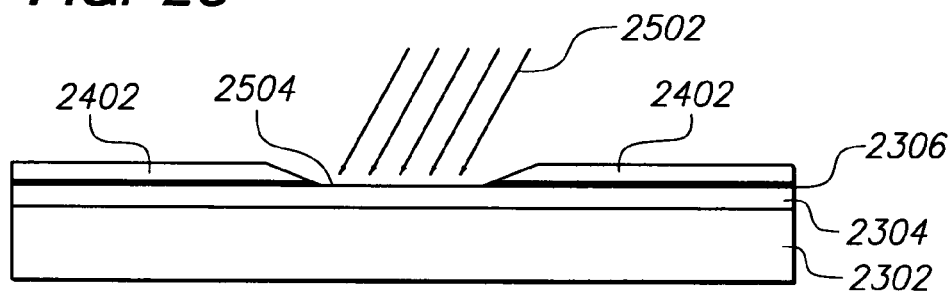
FIG. 25 is the third in the series of illustrations of FIGS. 23-29 of the partially-fabricated sensor structures, which is the same as that shown in FIG. 24 except that cap layer materials are removed in the central region through the central opening by etching, to thereby expose a top of the electrode through the central opening.

In FIG. 25, an etching process 2502 is performed to remove cap layer materials exposed through the central opening of patterned insulator 2402. Etching process 2502 may be or include an ion milling process (e.g. a low-energy ion mill), a sputter etching process, or a reactive ion etching (RIE) process. Etching process 2502 is continued until all exposed cap layer materials of cap layer 2306 are removed in the central region, so as to expose a top surface 2504 of first electrode 2304. Note that cap layer materials in the side regions, protected by patterned insulator 2402, remain intact. Thus, the cap layer has been formed into a patterned cap layer 2306 disposed underneath patterned insulator 2402. Note also that etching process 2502 does not substantially affect patterned insulator 2402 in the side regions of the structure.

Figure 26:
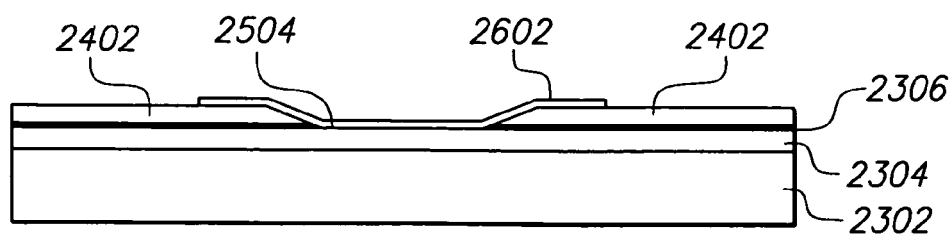
FIG. 26 is the fourth in the series of illustrations of FIGS. 23-29 of the partially-fabricated sensor structures, which is the same as that shown in FIG. 25 except that a tunnel barrier layer is formed over the top of the electrode through the central opening.
Figure 27:
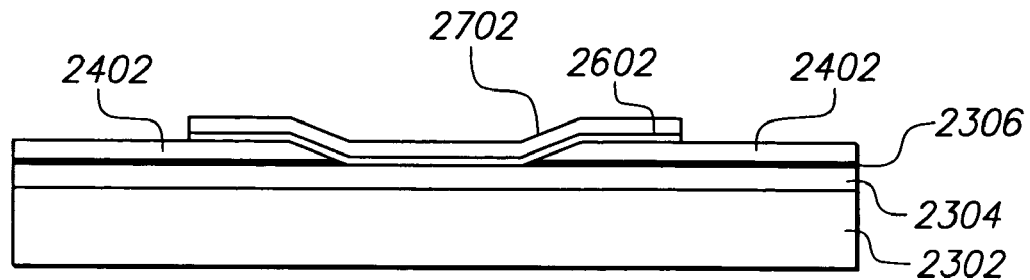
FIG. 27 is the fifth in the series of illustrations of FIGS. 23-29 of the partially-fabricated sensor structures, which is the same as that shown in FIG. 26 except that another electrode is formed over tunnel barrier layer.

In FIG. 26, a deposition process is performed so as to deposit a tunnel barrier layer 2604 over top surface 2504 of first electrode 2304 through the central opening of patterned insulator 2402, as well as over (at least a portion of) the top of patterned insulator 2402 itself. Tunnel barrier layer 2604 may be made of a non-magnetic insulating material, preferably made of $Al_2O_3$, which is e.g. generally less than 1 nm in thickness. Subsequently, in FIG. 27, a second electrode 2702 is deposited over tunnel barrier layer 2604. As apparent in FIGS. 26 and 27, tunnel barrier layer 2604 and second electrode 2702 may be patterned as well using any suitable lithography or formation process.

Figure 28:
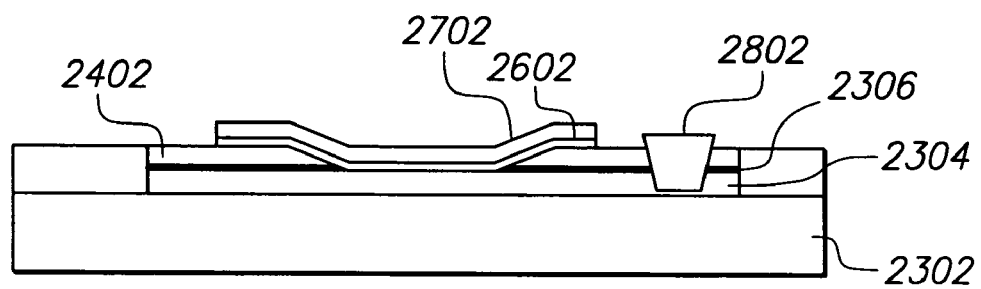
FIG. 28 is the sixth in the series of illustrations of FIGS. 23-29 of the partially-fabricated sensor structures, which is the same as that shown in FIG. 27 except that an electrode contact is formed in contact with the electrode.

In FIG. 28, a resulting sensor structure is shown, where a first conductive via 2802 is subsequently formed. First conductive via 2802 has a first end which makes contact with first electrode 2304 and a second end which is exposed. First conductive via 2802 may be formed by creating a via hole through patterned insulator 2402 and cap layer 2306 to expose underlying materials of first electrode 2304. Conductive materials are then formed in the via hole to form first conductive via 2802 coupled to the exposed electrode materials. Note that a second conductive via (not shown in FIG. 28) may be formed over and on top of second electrode 2702.

Figure 29:
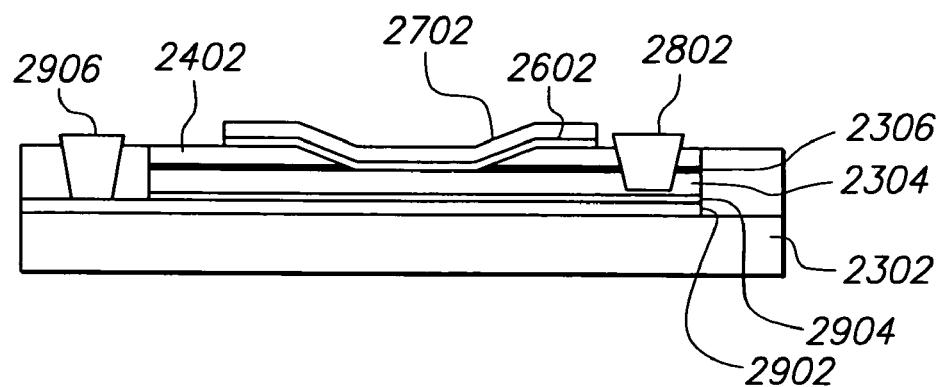
FIG. 29 is the seventh in the series of illustrations of FIGS. 23-29 of the partially-fabricated sensor structures, which is the same as that shown in FIG. 28 except that three electrodes and two tunnel barrier layers for a sensor are provided.

FIG. 29 is the same as that shown and described in relation to FIGS. 23-28, but a TTM is specifically produced which further includes a third electrode 2902 and another tunnel barrier layer 2904 formed in between collector substrate 2302 and first electrode 2304 as shown. A third conductive via 2906 may be provided with a first end which makes contact with third electrode 2902 and a second end which is exposed. Alternatively, third conductive via 2906 may be provided with a first end that does not make direct contact with third electrode 2902 but rather makes contact directly with collector substrate 2302. Specific materials and structures described in relation to FIGS. 7-22 may be utilized in this resulting TTM. Thus, the TTM of FIG. 29 may include collector substrate 2302, one or more first sensor layers formed over collector substrate 2302; patterned insulator 2402 which defines a central opening; and one or more second sensor layers formed over patterned insulator 2402 and over top layer of the one or more first sensor layers through the central opening of patterned insulator 2402. Patterned cap layer 2306 is formed under the patterned insulator 2402. In this example, the one or more first sensor layers are represented by first electrode 2304. The top layer of the one or more first sensor layers may be or include a ferromagnetic layer formed over collector substrate 2302. In this example, the one or more second sensor layers are represented by tunnel barrier layer 2602 and second electrode 2702. Second electrode 2702 may be or include a ferromagnetic layer. The one or more first sensor layers may further include third electrode 2902 and a second tunnel barrier layer 2904.

Advantageously, the TTMs of the present disclosure are suitable for incorporation into nanoscale devices which increase areal recording densities, therefore aiding the revolution in magnetic storage. The TTM may comprise an SVT or an MTT, as examples. A TTM of the present disclosure which is suitable for use in a magnetic head has a "collector" or collector substrate, one or more first sensor layers (e.g. including a "base") formed over the collector substrate; a patterned insulator which defines a central opening; and one or more second sensor layers (e.g. including an "emitter")

formed over the patterned insulator and over top layer of the one or more first sensor layers through the central opening of the patterned insulator. A disk drive of the present disclosure includes a slider, a magnetic head carried on the slider, a write head portion of the magnetic head, and a read head portion of the magnetic head which includes the TTM of the present disclosure.

Various embodiments and techniques have been provided. In one embodiment, the "collector" or collector substrate is formed with an elevated region surrounded by first and second recessed regions. First and second base lead layers are then formed in the first and the second recessed regions, respectively, followed by the formation of first and second hard bias structures over the first and the second base lead layers, respectively. The one or more first sensor layers includes a first tunnel barrier layer formed over the collector substrate in the elevated region and over the first and second base lead layers, where the top layer is a ferromagnetic free layer ("base") formed over the first tunnel barrier layer. The ferromagnetic free layer has first and second ends which make electrical contact with the first and the second hard bias structures. The one or more second sensor layers include a second tunnel barrier layer formed over the top layer comprising the ferromagnetic free layer, and a ferromagnetic pinned layer ("emitter") formed over the second tunnel barrier layer.

In another embodiment, the one or more first sensor layers includes a first ferromagnetic layer formed over the collector substrate, a first tunnel barrier layer formed over the first ferromagnetic layer, and a second ferromagnetic layer (i.e. the top layer) formed over the first tunnel barrier layer. A cap layer is formed over the second ferromagnetic layer. After the patterned insulator is formed, cap layer materials exposed via the central opening of the patterned insulator are etched away to thereby expose the top layer of the one or more first sensor layers (i.e. the second ferromagnetic layer). The one or more second sensor layers includes a second tunnel barrier layer formed over the top layer of the one or more first sensor layers and a third ferromagnetic layer formed over the second tunnel barrier layer.

It is to be understood that the above is merely a description of preferred embodiments of the invention and that various changes, alterations, and variations may be made without departing from the true spirit and scope of the invention as set for in the appended claims. For example, although the TTM is described as a three-leaded device, it may actually have three or more leads. Few if any of the terms or phrases in the specification and claims have been given any special particular meaning different from the plain language meaning to those ordinarily skilled in the art, and therefore the specification is not to be used to define terms in an unduly narrow sense.

What is claimed is:

1. A method for use in making a three terminal magnetic sensing device comprising the acts of:
    forming one or more first sensor layers over a collector substrate;
    forming, over the one or more first sensor layers, a patterned insulator which defines a central opening exposing a top layer of the one or more first sensor layers; and
    forming, through the central opening of the patterned insulator, one or more second sensor layers over the top layer of the one or more first sensor layers.

2. The method of claim 1, wherein the central opening has a width for defining a trackwidth of the magnetic sensing device.

3. The method of claim 1, wherein the one or more second sensor layers include a tunnel barrier layer in contact with the top layer of the one or more first sensor layers.

4. The method of claim 1, wherein the one or more first sensor layers comprise a base region and the one or more second sensor layers comprise an emitter region.

5. The method of claim 1, wherein the collector substrate is formed with an elevated region surrounded by first and second recessed regions.

6. The method of claim 1, wherein the collector substrate is formed with an elevated region surrounded by first and second recessed regions, and the method comprises the further acts of:
    forming first and second base lead layers in the first and the second recessed regions, respectively, each first and second base lead layer having a surface which is in contact with a bottom layer of the one or more second sensor layers.

7. The method of claim 1, wherein the collector substrate is formed with an elevated region surrounded by first and second recessed regions, and the method comprises the further acts of:
    forming first and second base lead layers in the first and the second recessed regions, respectively, each first and second base lead layer having a surface which is in contact with a bottom layer of the one or more second sensor layers; and
    wherein the top surfaces of the first and the second bas lead layers are substantially co-planar with the elevated region of the collector substrate.

8. The method of claim 1, wherein the collector substrate is formed with an elevated region surrounded by first and second recessed regions, the method comprises the further acts of:
    forming first and second base lead layers in the first and the second recessed regions, respectively;
    wherein the act of forming the one or more first sensor layers comprises the additional acts of:
        forming a tunnel barrier layer over the collector substrate in the elevated region and over the first and second base lead layers; and
        forming the top layer which comprises a ferromagnetic free layer over the tunnel barrier layer.

9. The method of claim 1, wherein the collector substrate is formed with an elevated region surrounded by first and second recessed regions, the method comprises the further acts of:
    forming first and second base lead layers in the first and the second recessed regions, respectively;
    forming first and second hard bias structures over the first and the second base lead layers, respectively;
    wherein the act of forming the one or more first sensor layers comprises the additional acts of:
        forming a tunnel barrier layer over the collector substrate in the elevated region and over the first and second base lead layers; and
        forming the top layer which comprises a ferromagnetic free layer over the tunnel barrier layer, the ferromagnetic free layer having first and second ends which make electrical contact with the first and the second hard bias structures.

10. The method of claim 1, wherein the collector substrate is formed with an elevated region surrounded by first and second recessed regions, the method comprises the further acts of:
    forming first and second base lead layers in the first and the second recessed regions, respectively;

forming first and second hard bias structures over the first and the second base lead layers, respectively;

wherein the act of forming the one or more first sensor layers comprises the additional acts of:

forming a first tunnel barrier layer over the collector substrate in the elevated region and over the first and second base lead layers; and forming the top layer which comprises a ferromagnetic free layer over the first tunnel barrier layer, the ferromagnetic free layer having first and second ends which make electrical contact with the first and the second hard bias structures;

wherein the act of forming the one or more second sensor layers comprises the additional acts of:

forming, through the central opening, a second tunnel barrier layer over the top layer comprising the ferromagnetic free layer;

forming a ferromagnetic pinned layer over the second tunnel barrier layer.

11. The method of claim 1, further comprising:

wherein the act of forming the one or more first sensor layers includes the act of forming a cap layer; and after forming the patterned insulator, etching away cap layer materials exposed via the central opening of the patterned insulator to thereby expose the top layer of the one or more sensor layers.

12. The method of claim 1, further comprising:

wherein the act of forming the one or more first sensor layers includes the act of forming a cap layer;

after forming the patterned insulator, etching away cap layer materials exposed via the central opening of the patterned insulator to thereby expose the top layer of the one or more first sensor layers; and wherein the act of forming the one or more second sensor layers includes the additional act of:

forming, through the central opening, a tunnel barrier layer over the top layer of the one or more first sensor layers.

13. The method of claim 1, further comprising:

wherein the act of forming the one or more first sensor layers includes the acts of forming the top layer as a ferromagnetic layer and subsequently forming a cap layer;

after forming the patterned insulator, etching away cap layer materials exposed via the central opening of the patterned insulator to thereby expose the top layer of the one or more first sensor layers;

wherein the act of forming the one or more second sensor layers includes the additional act of:

forming, through the central opening, a tunnel barrier layer over the top layer of the one or more first sensor layers comprising the ferromagnetic layer.

14. The method of claim 1, further comprising:

wherein the act of forming the one or more first sensor layers includes the additional acts of:

forming a first ferromagnetic layer over the collector substrate;

forming a first tunnel barrier layer over the first ferromagnetic layer;

forming a second ferromagnetic layer over the first tunnel barrier layer;

forming a cap layer over the second ferromagnetic layer;

after forming the patterned insulator, etching away cap layer materials exposed via the central opening of the patterned insulator to thereby expose the top layer of the one or more first sensor layers which comprises the second ferromagnetic layer;

wherein the act of forming the one or more second sensor layers includes the additional act of:

forming, through the central opening of the patterned insulator, a second tunnel barrier layer over the top layer of the one or more first sensor layers which comprises the second ferromagnetic layer; and forming a third ferromagnetic layer over the second tunnel barrier layer.

15. A three terminal magnetic sensing device, comprising:

a collector substrate;

one or more first sensor layers formed over the collector substrate;

a patterned insulator which defines a central opening; and one or more second sensor layers formed over the patterned insulator and over top layer of the one or more first sensor layers through the central opening of the patterned insulator.

16. The three terminal magnetic sensing device of claim 15, wherein the central opening has a width for defining a trackwidth of the magnetic sensing device.

17. The three terminal magnetic sensing device of claim 15, further comprising;

the one or more second sensor layers including a tunnel barrier layer in contact with the top layer of the one or more first sensor layers.

18. The three terminal magnetic sensing device of claim 15, further comprising:

the one or more second sensor layers including a tunnel barrier layer in contact with the top layer of the one or more first sensor layers; and the top layer comprising a ferromagnetic free layer.

19. The three terminal magnetic sensing device of claim 15, further comprising:

the collector substrate being formed with an elevated region surrounded by first and second recessed regions.

20. The three terminal magnetic sensing device of claim 15, further comprising:

the collector substrate being formed with an elevated region surrounded by first and second recessed regions;

first and second base lead layers formed in the first and the second recessed regions, respectively; and each first and second base lead layer having a surface which is in contact with a bottom layer of the one or more second sensor layers.

21. The three terminal magnetic sensing device of claim 15, further comprising:

the collector substrate being formed with an elevated region surrounded by first and second recessed regions;

first and second base lead layers formed in the first and the second recessed regions, respectively;

each first and second base lead layer having a surface which is in contact with a bottom layer of the one or more second sensor layers; and wherein the top surfaces of the first and the second base lead layers are substantially co-planar with the elevated region of the collector substrate.

22. The three terminal magnetic sensing device of claim 15, further comprising:

the collector substrate being formed with an elevated region surrounded by first and second recessed regions;

first and second base lead layers formed in the first and the second recessed regions, respectively;

the one or more first sensor layers including a tunnel barrier layer over the collector substrate in the elevated region and over the first and second base lead layers; and the top layer of the one or more first sensor layers including a ferromagnetic free layer formed over the tunnel barrier layer.

23. The three terminal magnetic sensing device of claim 15, further comprising:
the collector substrate being formed with an elevated region surrounded by first and second recessed regions;
first and second base lead layers formed in the first and the second recessed regions, respectively;
first and second hard bias structures formed over the first and the second base lead layers, respectively;
the one or more first sensor layers including a tunnel barrier layer over the collector substrate in the elevated region and over the first and second base lead layers;
the top layer of the one or more first sensor layers including a ferromagnetic free layer formed over the tunnel barrier layer; and
the ferromagnetic free layer having first and second ends which make electrical contact with the first and the second hard bias structures.

24. The three terminal magnetic sensing device of claim 15, further comprising:
a patterned cap layer formed under the patterned insulator.

25. A disk drive, comprising:
a slider;
a magnetic head carried on the slider;
a read head portion of the magnetic head including a three terminal magnetic sensing device;
the three terminal magnetic sensing device including:
a collector substrate;
one or more first sensor layers formed over the collector substrate;
a patterned insulator which defines a central opening; and
one or more second sensor layers formed over the patterned insulator and over top layer of the one or more first sensor layers through the central opening of the patterned insulator.

* * * * *